US012665601B2

(12) United States Patent
Yao et al.

(10) Patent No.: US 12,665,601 B2
(45) Date of Patent: Jun. 23, 2026

(54) OSCILLATOR CIRCUIT AND CURRENT COMPENSATION CIRCUIT FOR OSCILLATOR

(71) Applicant: M31 TECHNOLOGY CORPORATION, Hsinchu County (TW)

(72) Inventors: Chih-Chieh Yao, Hsinchu County (TW); Ting-Chun Huang, Hsinchu County (TW); Zheng-Bin Lou, Hsinchu County (TW); Chao-Ying Wang, Hsinchu County (TW); Huai-Te Wang, Hsinchu County (TW); Chia-Hsin Hsu, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 18/664,292

(22) Filed: May 15, 2024

(65) Prior Publication Data

US 2025/0357932 A1     Nov. 20, 2025

(51) Int. Cl.
H03L 1/00 (2006.01)
G05F 3/26 (2006.01)
H03L 7/099 (2006.01)

(52) U.S. Cl.
CPC ................ H03L 1/00 (2013.01); G05F 3/262 (2013.01); H03L 7/099 (2013.01)

(58) Field of Classification Search
CPC ........... H03L 1/00; H03L 7/099; G05F 3/262

(Continued)

(56) References Cited

U.S. PATENT DOCUMENTS 5,748,044 A     5/1998  Xue
8,400,227 B2 *  3/2013  Chang ..................... H03L 7/099
                                                                  331/34

(Continued)

FOREIGN PATENT DOCUMENTS

TW          202404267          1/2024

OTHER PUBLICATIONS

Office action dated Sep. 22, 2025 from the Taiwan corresponding application 114107460.

(Continued)

*Primary Examiner* — Arnold M Kinkead
(74) *Attorney, Agent, or Firm* — WPAT, P.C.; Anthony King

(57)          ABSTRACT

A current compensation circuit includes a current generating circuit and a signal generator. A first node of the current generating circuit is coupled to an input signal. A second node of the current generating circuit is coupled to a process-dependent current. The current generating circuit is configured to provide a compensation current according to the input signal and the process-dependent current. The signal generator is configured to couple a supply voltage to the first node to provide the input signal. A signal level of the input signal changes in response to a variation in the supply voltage. A supply node of an oscillator is arranged to receive a supply current to drive the oscillator. The current generating circuit is arranged to draw the compensation current from the supply node to compensate for a variation in the supply current generated in response to the variation in the supply voltage.

20 Claims, 12 Drawing Sheets

(58) Field of Classification Search
USPC .................. 331/175, 57, 182, 183, 185, 176
See application file for complete search history.

(56)                            References Cited

U.S. PATENT DOCUMENTS

| | | | |
|---|---|---|---|
| 12,278,641 B2 | 4/2025 | Shih et al. | |
| 2012/0193279 A1* | 8/2012 | Oesterreich ....... | A61M 5/14216 |
| | | | 604/93.01 |
| 2012/0194279 A1 | 8/2012 | Nonis et al. | |

OTHER PUBLICATIONS

English Summary of the Office Action issued by TIPO dated Sep. 22, 2025 for TW 114107460.
U.S. Appl. No. 12/278,641 is the counterpart to TW202404267.

* cited by examiner

OSCILLATOR CIRCUIT AND CURRENT COMPENSATION CIRCUIT FOR OSCILLATOR

BACKGROUND

The present disclosure relates to oscillator circuits and, more particularly, to a current compensation circuit for an oscillator, and an oscillator circuit with immunity to power supply variations.

A system-on-chip (SoC) is an integrated circuit (IC) that incorporates components of an entire electronic system onto a single platform. Power supplies drive numerous functional blocks that are densely integrated on the same chip. The SoC can downsize what are normally multi-chip designs onto a single processor, thereby reducing energy waste and the space occupied by large systems. However, high operating frequencies of the SoC will cause the power supplies to drive rapidly changing loads, thus creating noise in the power supply buses. The created noise degrades the power supply rejection ratio (PSRR), and is propagated throughout the chip to create jitter, which deteriorates a dynamic range of a sensitive function block such as a phase-locked loop (PLL). In the advanced node SoC design, PSRR degradation is exacerbated due to the reduction in supply voltage. Thus, there is a need in the art for an improved design to reduce the adverse effects resulting from the power supply variations.

SUMMARY

The described embodiments provide a current compensation circuit for an oscillator, and an oscillator circuit with high immunity to power supply variations.

Some embodiments described herein may include a current compensation circuit for an oscillator. The current compensation circuit includes a current generating circuit and a signal generator. The current generating circuit has a first node and a second node. The first node is coupled to an input signal. The second node is coupled to a process-dependent current. The current generating circuit is configured to provide a compensation current according to the input signal and the process-dependent current. The signal generator, coupled to the current generating circuit, is configured to couple a supply voltage to the first node to provide the input signal. A signal level of the input signal changes in response to a variation in the supply voltage. A supply node of an oscillator is arranged to receive a supply current to drive the oscillator. The current generating circuit is arranged to draw the compensation current from the supply node to compensate for a variation in the supply current generated in response to the variation in the supply voltage.

Some embodiments described herein may include an oscillator circuit. The oscillator circuit includes a current generator, and oscillator and a current compensation circuit. The current generator is supplied by a supply voltage to output a supply current. The oscillator has a supply node arranged to receive the supply current. The oscillator is arranged to generate an oscillating signal according to a driving current. A first portion of the supply current flows into the oscillator from the supply node of the oscillator to serve as the driving current. The current compensation circuit, coupled to the supply node of the oscillator, is configured to generate a first portion of a compensation current according to the supply voltage and a reference signal, and generate a second portion of the compensation current according to a first process-dependent current. A signal level of the reference signal is independent of a variation in the supply voltage, and the first portion of the compensation current changes in response to the variation in the supply voltage. The current compensation circuit is arranged to draw the compensation current from the supply node of the oscillator to compensate for a variation in the supply current generated in response to the variation in the supply voltage.

With the use of the proposed current compensation scheme, an oscillator circuit can generate an oscillating signal of a stable or substantially fixed frequency under power supply variations. The proposed current compensation scheme can enable the oscillator circuit to enhance the immunity to power supply noise. In addition, the oscillator circuit can be utilized to implement a PLL with reduced jitter and phase noise. The proposed current compensation scheme can improve the PSRR performance without increasing the voltage headroom of the PLL.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
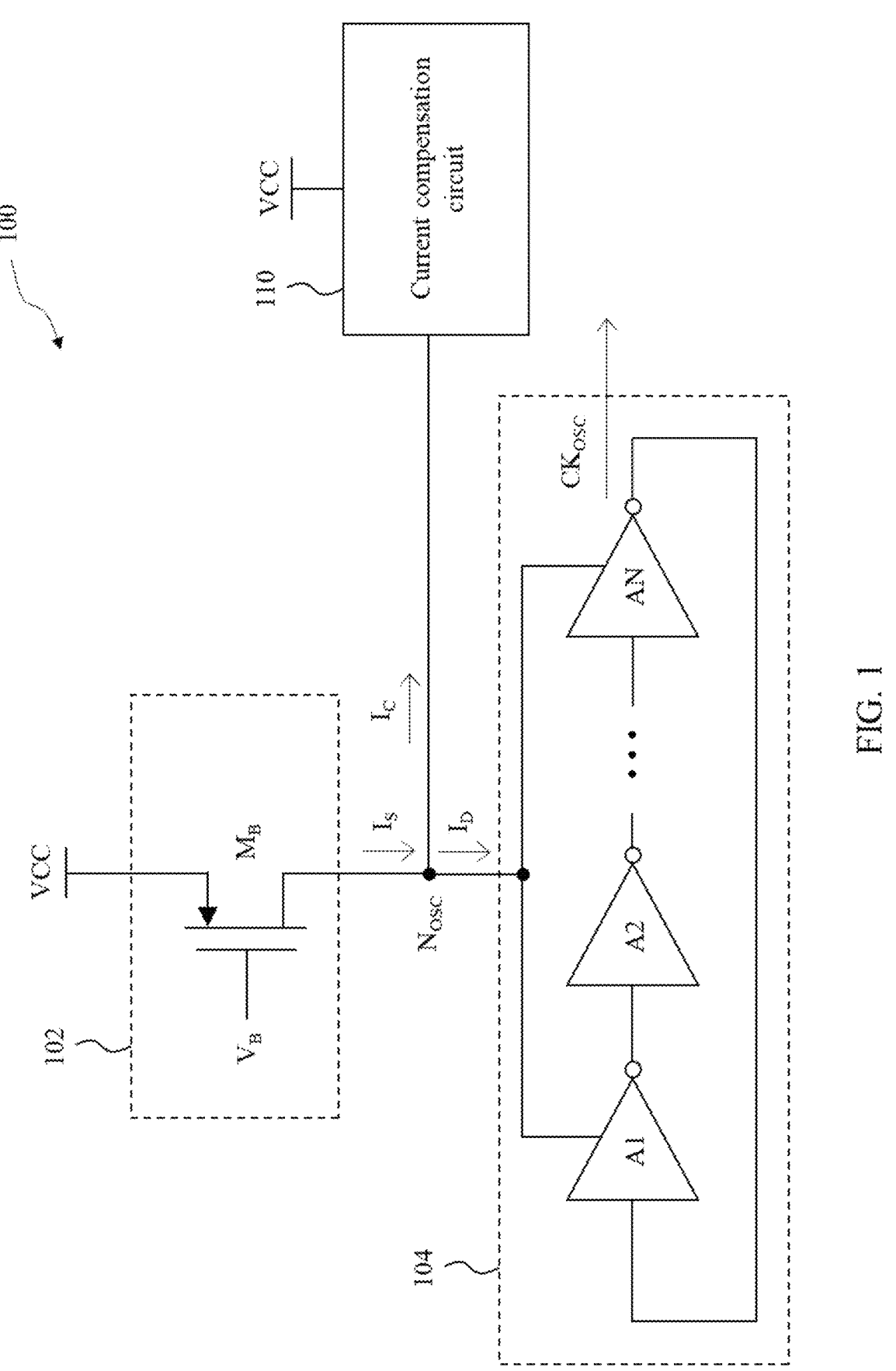
FIG. 1 is a diagram illustrating an exemplary oscillator circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

To enhance the ability to reject power supply ripples, a PLL may utilize a high impedance path to reduce variations in a supply current injected to a current-controlled oscillator. For example, a cascode circuit that is implemented using two transistors connected in series can be provided between a power supply and the current-controlled oscillator in order to reduce ripples in the supply current. In some fabrication processes, however, the transistors employed in the cascode circuit exhibit relatively low output resistance. Connecting the cascode circuit between the power supply and the current-controlled oscillator is not enough to provide good jitter performance.

One method is to add a gain boosting stage at the output of the cascode circuit, thereby increasing the output impedance looking into the output of the cascode circuit. However, one or more transistors of the gain boosting stage will be connected in series with the transistors of the cascode circuit, resulting in an increase in voltage headroom. This method would not work for circuit design at advanced technology nodes.

The present disclosure describes exemplary current compensation circuits, each of which can generate a compensation current by emulating/simulating the effect of process, voltage and/or temperature variations on a supply current injected to a supply node of an oscillator. The current compensation circuit can draw the compensation current from the supply node to compensate for a variation in the supply current. For example, the compensation current can be sourced from the supply current, and can be equivalent to a portion of the supply current that changes in response to the process, voltage and/or temperature variations. Another portion of the supply current, which is unaffected or substantially unaffected by the process, voltage and/or temperature variations, can flow into the oscillator through the supply node to serve as a driving current for controlling an oscillation frequency of the oscillator. Thus, the oscillation frequency can be unaffected or substantially unaffected by power supply variations.

The present disclosure further describes exemplary oscillator circuits with high immunity to power supply variations. Each oscillator circuit can be employed in a PLL for reducing the phase noise and jitter. Further description is provided below.

FIG. 1 is a diagram illustrating an exemplary oscillator circuit in accordance with some embodiments of the present disclosure. The oscillator circuit 100 can be utilized to implement a PLL with high immunity to power supply noise. However, this is not intended to be limiting. Those skilled in the art will appreciate that the oscillator circuit 100 can be employed in other circuitry or devices without departing from the scope of the present disclosure. In addition, an oscillator included in the oscillator circuit 100 may be implemented using a current-controlled oscillator, in which an oscillation frequency is controlled by a control current injected thereto. This example is provided for illustrative purposes and is not to be construed as limiting. The proposed current compensation scheme can be applied other types of oscillators, such as a voltage-controlled oscillator or a hybrid controlled oscillator, without departing from the scope of the present disclosure.

The oscillator circuit 100 may include, but is not limited to, a current generator 102, an oscillator 104 and a current compensation circuit 110. The current generator 102 is supplied by a supply voltage VCC to output a supply current $I_S$. The oscillator 104 can be arranged to generate an oscillating signal $CK_{OSC}$ according to a control current injected thereto. For example, the oscillator 104 has a supply node $N_{OSC}$ that is arranged to receive the supply current $I_S$. The supply current $I_S$ can flow into the supply node $N_{OSC}$ to drive the oscillator 104. A driving current $I_D$ sourced from the supply current $I_S$ can serve as the control current of the oscillator 104. For example, a frequency of the oscillating signal $CK_{OSC}$ can be controlled by the driving current $I_D$.

The current compensation circuit 110, coupled to the supply node $N_{OSC}$, can be arranged to draw a current $I_C$ from the supply node $N_{OSC}$ to thereby compensate for the effect of power supply noise on the supply current $I_S$. For example, a variation in the supply voltage VCC can cause a variation in the supply current $I_S$. The current $I_C$ can be a compensation current generated by emulating/simulating the effect of power supply noise on the supply current $I_S$. The driving current $I_D$ may stay at a constant or substantially constant level under power supply variations. Thus, the frequency of the oscillating signal $CK_{OSC}$ may be kept at constant or substantially constant under power supply variations.

By way of example but not limitation, the current generator 102 may be implemented using a transistor $M_B$ biased with a voltage $V_B$, and the oscillator 104 may be implemented using a ring oscillator. The oscillator 104 in combination with the current generator 102 can be regarded as a voltage-controlled oscillator. In the example of FIG. 1, the oscillator 104 may include N inverters A1-AN connected in series. N is an integer greater than one. Note that the current generator 102 and/or the oscillator 104 can be implemented using other circuit structures without departing from the scope of the present disclosure.

When the supply voltage VCC increases because of power supply noise, the supply current $I_S$ will increase accordingly. The current compensation circuit 110 can generate the current $I_C$ (e.g. a compensation current) which can exhibit the effect of power supply noise on the supply current $I_S$. The current $I_C$ can be a portion of the supply current $I_S$ that flows from the supply node $N_{OSC}$ to the current compensation circuit 110. Another portion of the supply current $I_S$ that flows from the supply node $N_{OSC}$ to the oscillator 104 may serve as the driving current $I_D$. Note that the driving current $I_D$ can be a result of subtraction of the current $I_C$ from the supply current $I_S$, and therefore can stay at a constant or substantially constant level. By emulating/simulating the effect of power supply noise on the supply current $I_S$, the current compensation circuit 110 can reduce/eliminate the impact of the power supply noise on the frequency stability of the oscillator 104.

In some embodiments, process and/or temperature variations in the current generator 102 and the oscillator 104 may result in different responses of the supply current $I_S$ to power supply noise. The current compensation circuit 110 may further emulate/simulate the effect of process and/or temperature variations to generate the current $I_C$ for noise compensation.

For example, consider a case where a first circuit and a second circuit are both implemented using the same structure formed by the current generator 102 and the oscillator 104. When subjected to the same power supply noise or voltage variation, the first and second circuits may exhibit different current responses due to process variations. Additionally or alternatively, the first/second circuit may exhibit different current responses when subjected to the same power supply noise or voltage variation at different temperatures. In other words, a variation in a supply current induced by power supply noise may differ depending on process and/or temperature variations. The proposed current compensation scheme can compensate for a variation in a supply current that is caused by process, voltage and/or temperature variations.

Figure 2:
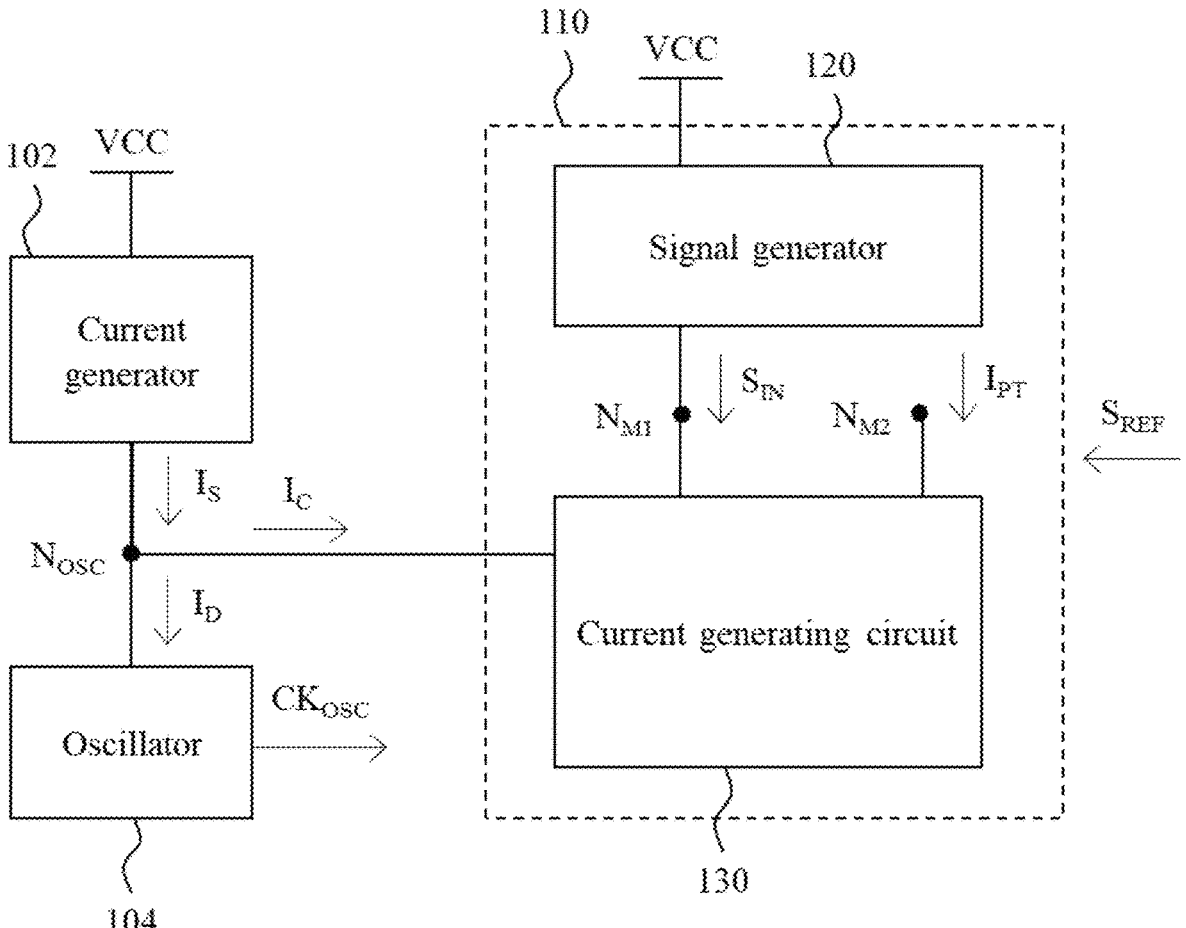
FIG. 2 is an implementation of the oscillator circuit shown in FIG. 1 in accordance with some embodiment of the present disclosure.

FIG. 2 is an implementation of the oscillator circuit 100 shown in FIG. 1 in accordance with some embodiment of the present disclosure. The current compensation circuit 110 includes, but is not limited to, a signal generator 120 and a current generating circuit 130. The signal generator 120 can be configured to couple the supply voltage VCC to a node $N_{M1}$ of the current generating circuit 130 to provide an input signal $S_{IN}$. The signal level of the input signal $S_{IN}$ can change in response to a variation in the supply voltage VCC. In other words, the input signal $S_{IN}$ can be related to voltage variations. In some examples, the input signal $S_{IN}$ can be a current signal that can indicate the effect of the variation in the supply voltage VCC on the supply current $I_S$. In some other examples, the input signal $S_{IN}$ can be a voltage signal that carries information on the variation in (or a noise component of) the supply voltage VCC.

The nodes $N_{M1}$ and $N_{M2}$ of the current generating circuit 130 can be coupled to the input signal $S_{IN}$ and the process-dependent current $I_{PT}$, respectively. The current generating circuit 130 can be configured to provide a compensation current (i.e. the current $I_C$) according to the input signal $S_{IN}$ and the process-dependent current $I_{PT}$. Note that the current $I_C$ can flow out of the supply node $N_{OSC}$ to compensate for a variation in the supply current $I_S$ that is caused by process, voltage and/or temperature variations.

The process-dependent current $I_{PT}$ can be related to process variations. For example, if the proposed current compensation scheme was not applied to the oscillator 104, the supply current $I_S$ would exhibit changes in response to process variations in transistor(s). To compensate for process variations, the current generating circuit 130 can provide the process-dependent current $I_{PT}$ by emulating/simulating the effect of process variations on the supply current $I_S$. In some embodiments, the process-dependent current $I_{PT}$ may be further dependent on temperature. The process-dependent current $I_{PT}$ can be steered toward or away from the current generating circuit 130 to thereby compensate for process and temperature variations.

In operation, the supply current $I_S$ can be supplied to the supply node $N_{OSC}$ to drive the oscillator 104. The signal generator 120 can provide the input signal $S_{IN}$ that can exhibit changes in response to a variation in the supply voltage VCC. The process-dependent current $I_{PT}$ that is related to process and/or temperature variations can flow though the node $N_{M2}$. The current generating circuit 130 can draw the current $I_C$ from the supply node $N_{OSC}$ according to the input signal $S_{IN}$ and the process-dependent current $I_{PT}$, thereby compensating for a variation in the supply current $I_S$ that is generated in response to a variation in the supply voltage VCC. Note that the variation in the supply current $I_S$ generated in response to the variation in the supply voltage VCC might differ depending on process and/or temperature variations. With the use of the current $I_C$ that is related to not only the of power supply noise on the supply current $I_S$, but also the effect of process and/or temperature variations on the supply current $I_S$, the current generating circuit 130 can compensate for a variation in the supply current $I_S$ that is caused by process, voltage and/or temperature variations. The oscillator 104 can generate the oscillating signal $CK_{OSC}$ according to the driving current $I_D$ having a constant or substantially constant level.

With the use of the proposed current compensation scheme, an oscillator circuit can generate an oscillating signal of a stable or substantially fixed frequency under power supply variations. The proposed current compensation scheme can enable the oscillator circuit to enhance the immunity to power supply noise. In addition, the oscillator circuit can be utilized to implement a PLL with reduced jitter and phase noise.

To facilitate understanding of the present disclosure, some embodiments are given as follows for further description of the proposed current compensation scheme. Those skilled in the art should appreciate that other embodiments employing the circuit structure shown in FIG. 1 or FIG. 2 are also within the contemplated scope of the present disclosure.

Figure 3:
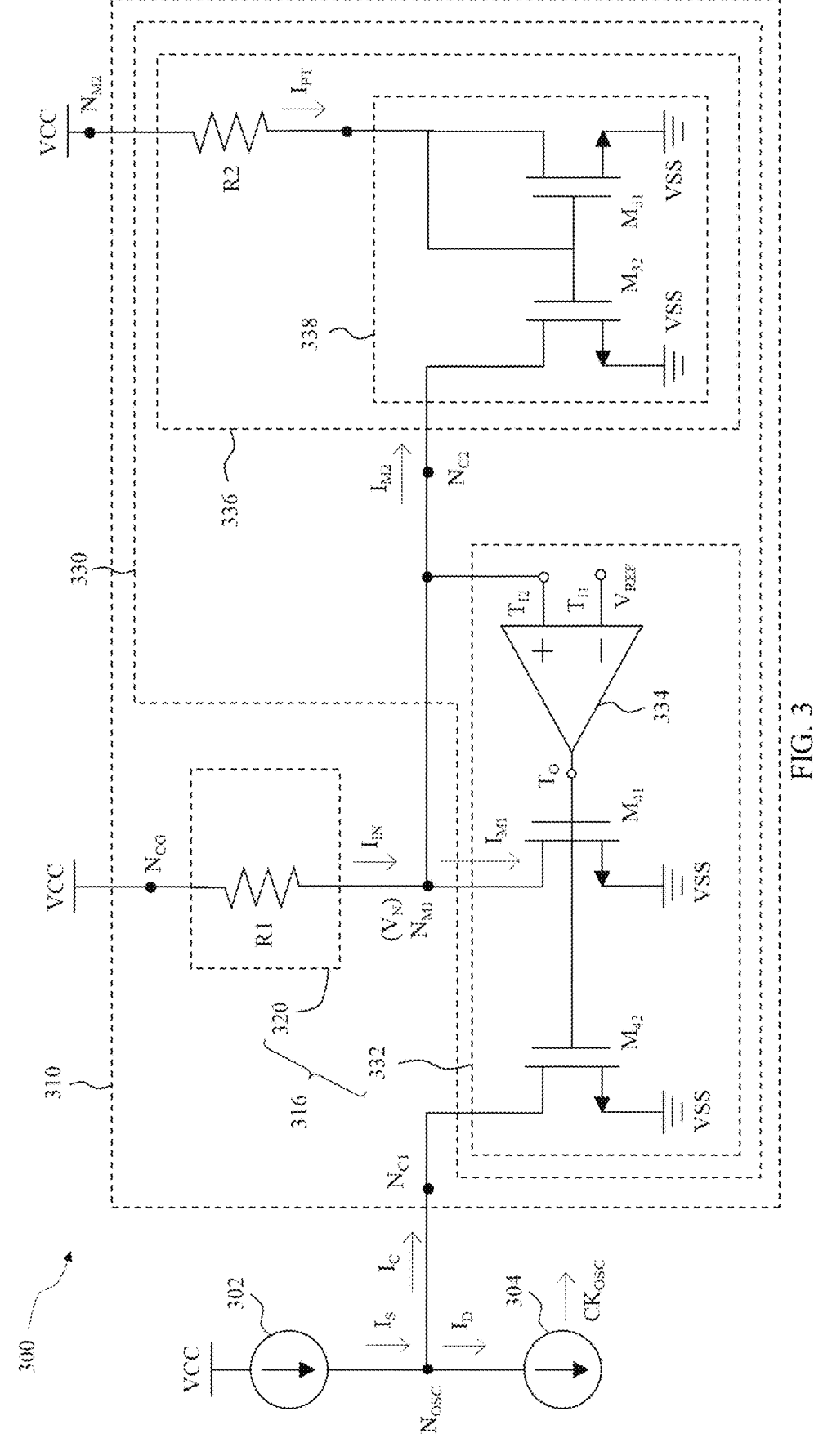
FIG. 3 illustrates an implementation of the oscillator circuit shown in FIG. 1 in accordance with some embodiments of the present disclosure.

FIG. 3 illustrates an implementation of the oscillator circuit 100 shown in FIG. 1 in accordance with some embodiments of the present disclosure. The oscillator circuit 300 may include a current generator 302, an oscillator 304 and a current compensation circuit 310. The current generator 302 and the oscillator 304 can be implemented using the current generator 102 and the oscillator 104 shown in FIG. 1, respectively. Each of the current generator 302 and the oscillator 304 can be represented by a current source symbol. In addition, the current compensation circuit 310 can be an embodiment of the current compensation circuit 110 shown in FIG. 2. The current compensation circuit 310 may include a signal generator 320 and a current generating circuit 330, which can be respective embodiments of the signal generator 120 and the current generating circuit 130 shown in FIG. 2.

In the present embodiment, the input signal $S_{IN}$ shown in FIG. 2 can be an input current $I_{IN}$ flowing into the node $N_{M1}$. For example, the current generating circuit 330 can be configured to provide a node voltage $V_N$ at the node $N_{M1}$. A voltage level of the node voltage $V_N$ is independent or almost independent of a variation in the supply voltage VCC. The signal generator 320 has a supply node $N_{CG}$ coupled to the supply voltage VCC. The signal generator 320 can be configured to provide the input current $I_{IN}$ according to a difference between the supply voltage VCC and the node voltage $V_N$. The input current $I_{IN}$ flows into the node $N_{M1}$ to serve as an embodiment of the input signal $S_{IN}$ shown in FIG. 2.

The signal generator 320 can be implemented using a current source arranged for providing the input current $I_{IN}$. In the example of FIG. 3, the signal generator 320 can be implemented using a resistor current source, which includes a resistive element R1 coupled between the supply node $N_{CG}$ and the node $N_{M1}$. The magnitude of the input current $I_{IN}$ can be equal to or substantially equal to the difference between the supply voltage VCC and the node voltage $V_N$ divided by the resistance of the resistive element R1.

The current generating circuit 330 may include, but is not limited to, a current mirror 332 and a current generator 336. The current mirror 332 is coupled to the signal generator 320 through the node $N_{M1}$, and has a node $N_{C1}$ coupled to the supply node $N_{OSC}$. The current mirror 332 is arranged to provide the node voltage $V_N$ at the node $N_{M1}$, draw a first portion of the input current $I_{IN}$ (i.e. a current $I_{M41}$) from the node $N_{M1}$, and mirror the first portion of the input current $I_{IN}$ to provide the current $I_C$. The current $I_C$ can flow into the current mirror 332 from the node $N_{C1}$.

By way of example but not limitation, the current mirror 332 may include an amplifier 334, and transistors M41 and M42. The amplifier 334 has an input terminal TI1, an input terminal TI2 and an output terminal TO. The input terminal TI1 is coupled to a reference voltage VREF. The input terminal TI2 is coupled to the node NM1, and arranged to provide the node voltage VN at the node NM1 according to the reference voltage VREF. The reference voltage VREF may be insensitive to or independent of process, voltage and temperature (PVT) variations. For example, the reference voltage VREF can be provided by a bandgap voltage reference. In addition, the node voltage VN may be equal to or substantially equal to the reference voltage VREF. In the example of FIG. 3, the amplifier 334 can be implemented using an operational amplifier that has a very large or almost infinite gain, thereby forming a virtual short circuit in which the voltages at the inverting and noninverting terminals are equal or substantially equal.

Respective control terminals of the transistors $M_{41}$ and $M_{42}$ are coupled to the output terminal $T_O$. A first connection terminal of the transistor $M_{41}$ is coupled to the node $N_{M1}$, and the current $I_{M41}$ flows into the transistor $M_{41}$ from the first connection terminal of the transistor $M_{41}$. A first connection terminal of the transistor $M_{42}$ is coupled to the node $N_{C1}$, and the current $I_C$ flows into the transistor $M_{42}$ from the first connection terminal of the transistor $M_{42}$. In addition, respective second connection terminals of the transistors $M_{41}$ and $M_{42}$ can be coupled to a reference voltage VSS, such as a ground voltage.

In addition, the current generator 336 is coupled to the supply voltage VCC through the node $N_{M2}$, and has a node $N_{C2}$ coupled to the node $N_{M1}$. The current generator 336 can be configured to draw a second portion of the input current $I_{IN}$ (i.e. a current $I_{M42}$) from the node $N_{M1}$ according to the process-dependent current $I_{PT}$. The current generator 336 may include, but is not limited to, a current mirror 338 and a resistive element R2. The current mirror 338 can be arranged to mirror the process-dependent current $I_{PT}$ to draw the current $I_{M42}$ (i.e. the second portion of the input current $I_{IN}$) from the node $N_{M2}$. The current $I_{M42}$ can be regarded as a process-dependent current.

Both of the process-dependent current $I_{PT}$ and the current $I_{M42}$ can be related to the effect of process variations on the supply current $I_S$. By way of example but not limitation, the current generator 302 or the oscillator 304 can be a MOS-based circuit, which is developed based on metal-oxide-semiconductor field-effect transistors (MOSFETs). The process-dependent current $I_{PT}$ can flow through a transistor of the current mirror 338, and hence can be related to a current response of the transistor to process variations. The current $I_{M42}$, produced in response to the process-dependent current $I_{PT}$, can also be related to a current response of the transistor to process variations. Note that the transistor of the current mirror 338 may exhibit temperature dependent characteristics. The process-dependent current $I_{PT}$ and the current $I_{M42}$ can be further related to a current response of the transistor to temperature variations.

In the example of FIG. 3, the current mirror 338 may include the transistors $M_{31}$ and $M_{32}$. A first connection terminal of the transistor $M_{31}$ is coupled to the control terminal of the transistor $M_{31}$, and arranged to receive the process-dependent current $I_{PT}$. A control terminal of the transistor $M_{32}$ is coupled to the control terminal of the transistor $M_{31}$. A first connection terminal of the transistor $M_{32}$ is coupled to the node $N_{C2}$, and arranged to receive the current $I_{M42}$. In other words, the current $I_{M42}$ leaving the node $N_{M1}$ can flow into the transistor $M_{32}$ from the first connection terminal of the transistor $M_{32}$. In addition, respective second connection terminals of the transistors $M_{31}$ and $M_{32}$ are coupled to the reference voltage VSS. Note that each of the transistors $M_{31}$ and $M_{32}$ can be implemented as an n-channel transistor. The current $I_{M42}$ can be related to the effect of process variations in the oscillator 304 (or the current generator 302) if the oscillator 304 (or the current generator 302) is NMOS (n-channel MOSFET) dominant.

A terminal of the resistive element R2 is coupled to the supply voltage VCC through the node $N_{M2}$, and another terminal of the resistive element R2 is coupled to the first connection terminal of the transistor $M_{31}$. The process-dependent current $I_{PT}$ can flow through a transistor of the current mirror 338 (e.g. the transistor $M_{31}$) and the resistive element R2. Note that the resistance of the resistive element R2 can change with temperature. Steering the process-dependent current $I_{PT}$ to or from the resistive element R2 can achieve better temperature compensation. For example, the resistive element R2 can alleviate or prevent overcompensation of temperature variations.

In operation, the current generator 302 outputs the supply current $I_S$ to the supply node $N_{OSC}$ according to the supply voltage VCC. The signal generator 320 can provide the input current $I_{IN}$ that varies with the supply voltage VCC. The input current $I_{IN}$ can be divided into different portions at the node $N_{M1}$ that has a constant or substantially constant voltage, i.e. the node voltage $V_N$.

For example, the voltage difference across the resistive element R1 causes the input current $I_{IN}$ to flow into the node $N_{M1}$. The voltage difference across the resistive element R2 causes the process-dependent current $I_{PT}$ to flow into the node $N_{M2}$. The process-dependent current $I_{PT}$ can be process and temperature dependent since the process-dependent current $I_{PT}$ flows through the resistive element R2 and the transistor $M_{31}$. The current mirror 338 can draw the process-dependent current $I_{PT}$ into the transistor $M_{31}$, and mirror the process-dependent current $I_{PT}$ to provide the current $I_{M42}$, which is a portion of the input current $I_{IN}$ that flows into the transistor $M_{32}$. Another portion of the input current $I_{IN}$ flows into the transistor $M_{41}$ to serve as the current $I_{M41}$, which can be related to the effect of PVT variations.

In addition, the current mirror 332 can mirror the current $I_{M41}$ to provide the current $I_C$, i.e. a compensation current. The current $I_C$ can flow out of the supply node $N_{OSC}$ to compensate for a variation in the supply current $I_S$. The oscillator 304 can generate the oscillating signal $CK_{OSC}$ of a stable or substantially fixed frequency according to the driving current $I_D$.

Note that as the process-dependent current $I_{PT}$ can be related to a current response of a transistor to process variations, the oscillator circuit 300 can achieve a high PSRR over different process corners. In addition, the oscillator circuit 300 can have a low temperature coefficient with the aid of a temperature response of the process-dependent current $I_{PT}$. For example, when the supply current $I_S$ increases in response to an increase in temperature, the process-dependent current $I_{PT}$ flowing through the resistive element R2 and the transistor $M_{31}$ can decrease. The current $I_{M42}$ may decrease with a decrease in the process-dependent current $I_{PT}$, and the current $I_{M41}$ may increase with a decrease in the current $I_{M42}$, resulting in an increase in the current $I_C$. Thus, the driving current $I_D$ may be kept at a substantially constant level. In other words, the oscillator circuit 300 can have a low temperature coefficient.

The circuit structure shown in FIG. 3 is provided for illustrative purposes, and is not intended to limit the scope of the present disclosure. In some embodiments, the node voltage $V_N$ may be provided by other circuits or devices that are capable of generating a voltage independent of a variation in the supply voltage VCC. In some embodiments, the signal generator 320 can be implemented using other circuit structures, each of which can output a current that varies with the supply voltage VCC. In some embodiments, other circuits/devices capable of generating a temperature-dependent current can be used to replace the resistive element R2.

Figure 4:
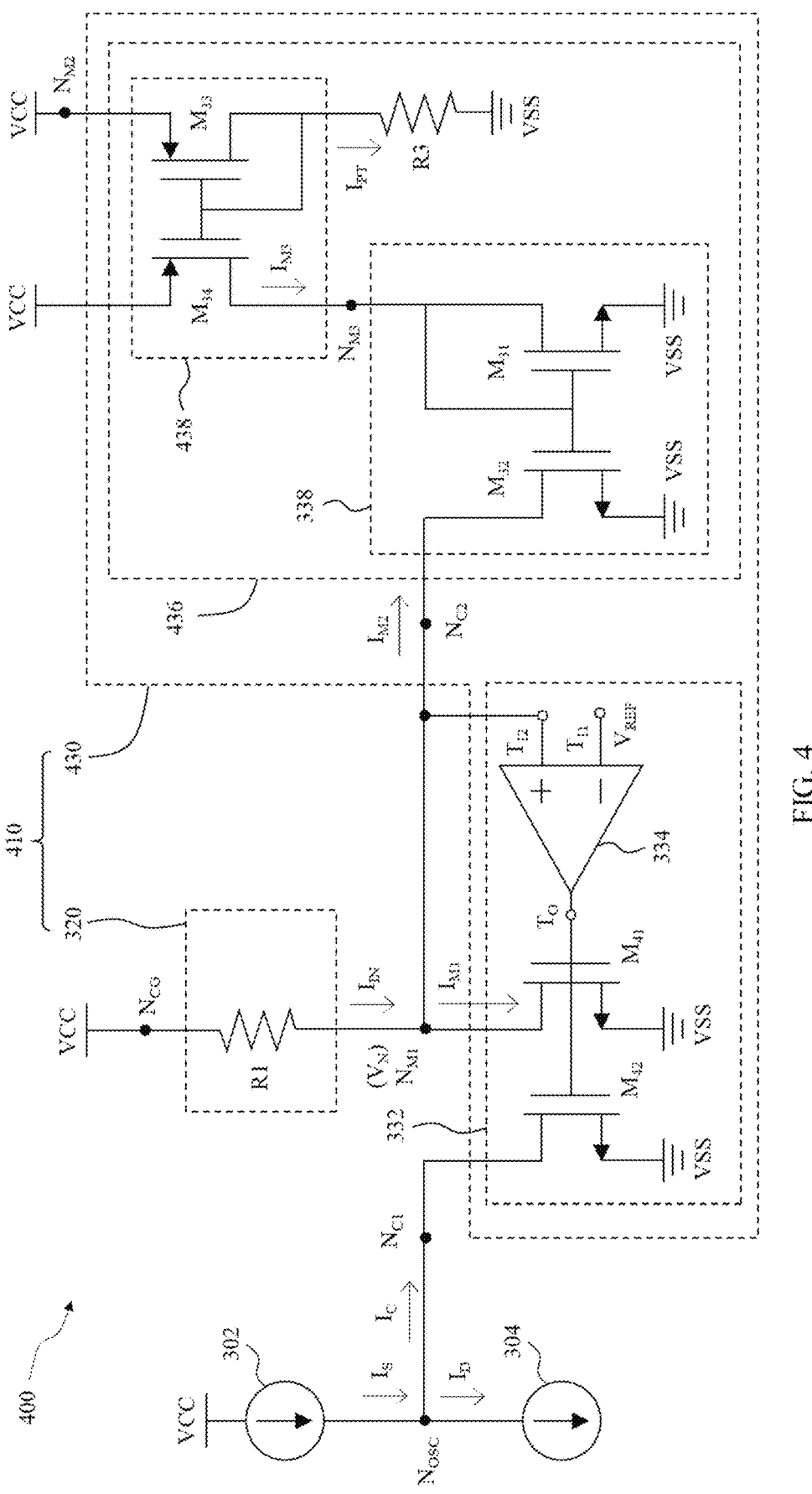
FIG. 4 illustrates an implementation of the oscillator circuit shown in FIG. 1 in accordance with some embodiments of the present disclosure.

FIG. 4 illustrates an implementation of the oscillator circuit 100 shown in FIG. 1 in accordance with some embodiments of the present disclosure. The oscillator circuit 400 may include the current generator 302 and the oscillator 304 shown in FIG. 3, and further include a current compensation circuit 410. The structure of the current compensation circuit 410 is similar/identical to that of the current compensation circuit 310 shown in FIG. 3 except for the current generator 436 included in the current generating circuit 430.

The current generator 436 may include the current mirror 338 shown in FIG. 3, a current mirror 438 and a resistive element R3. The current mirror 438 is coupled to the current mirror 338 through the node $N_{M3}$. The current mirror 438, coupled to the node $N_{M2}$, can be arranged to mirror the process-dependent current $I_{PT}$ to provide an intermediate current (i.e. a current $I_{M3}$) flowing through a node $N_{M3}$. The current mirror 338, coupled to the current mirror 438 through the node $N_{M3}$, is arranged to mirror the current $I_{M3}$ to draw the current $I_{M2}$ from the node $N_{M1}$. Note that the current $I_{M3}$ can be related to the effect of process variations on the supply current $I_S$. For example, the current generator 302 or the oscillator 304 can be a MOS-based circuit. The process-dependent current $I_{PT}$ can flow through a transistor of the current mirror 438 such that each of the process-dependent current $I_{PT}$ and the current $I_{M3}$ can be related to a current response of the transistor to process variations.

In the example of FIG. 4, the current mirror 438 may include the transistors $M_{33}$ and $M_{34}$. Respective control terminals of the transistors $M_{33}$ and $M_{34}$ are coupled to a first connection terminal of the transistor $M_{33}$. Respective first connection terminals of the transistors $M_{33}$ and $M_{34}$ are coupled to the supply voltage VCC. Respective second connection terminals of the transistors $M_{33}$ and $M_{34}$ are coupled to the resistive element R3 and the node $N_{M3}$, respectively. Note that each of the transistors $M_{33}$ and $M_{34}$ can be implemented as a p-channel transistor. The process-dependent current $I_{PT}$ can be related to the effect of process variations in the oscillator 304 (or the current generator 302) if the oscillator 304 (or the current generator 302) is PMOS (p-channel MOSFET) dominant.

A terminal of the resistive element R3 is coupled to the second connection terminal of the transistor $M_{33}$, and another terminal of the resistive element R3 is coupled to the reference voltage VSS. The process-dependent current $I_{PT}$ can flow through a transistor of the current mirror 438 (e.g. the transistor $M_{33}$) and the resistive element R3. Note that the resistance of the resistive element R3 can change with temperature. Steering the process-dependent current $I_{PT}$ to or from the resistive element R3 can achieve better temperature compensation. For example, the resistive element R3 can alleviate or prevent overcompensation of temperature variations.

As those skilled in the art can appreciate the operation of the oscillator circuit 400 shown in FIG. 4 after reading the above paragraphs directed to FIG. 1 to FIG. 3, further description is omitted here for brevity.

Figure 5:
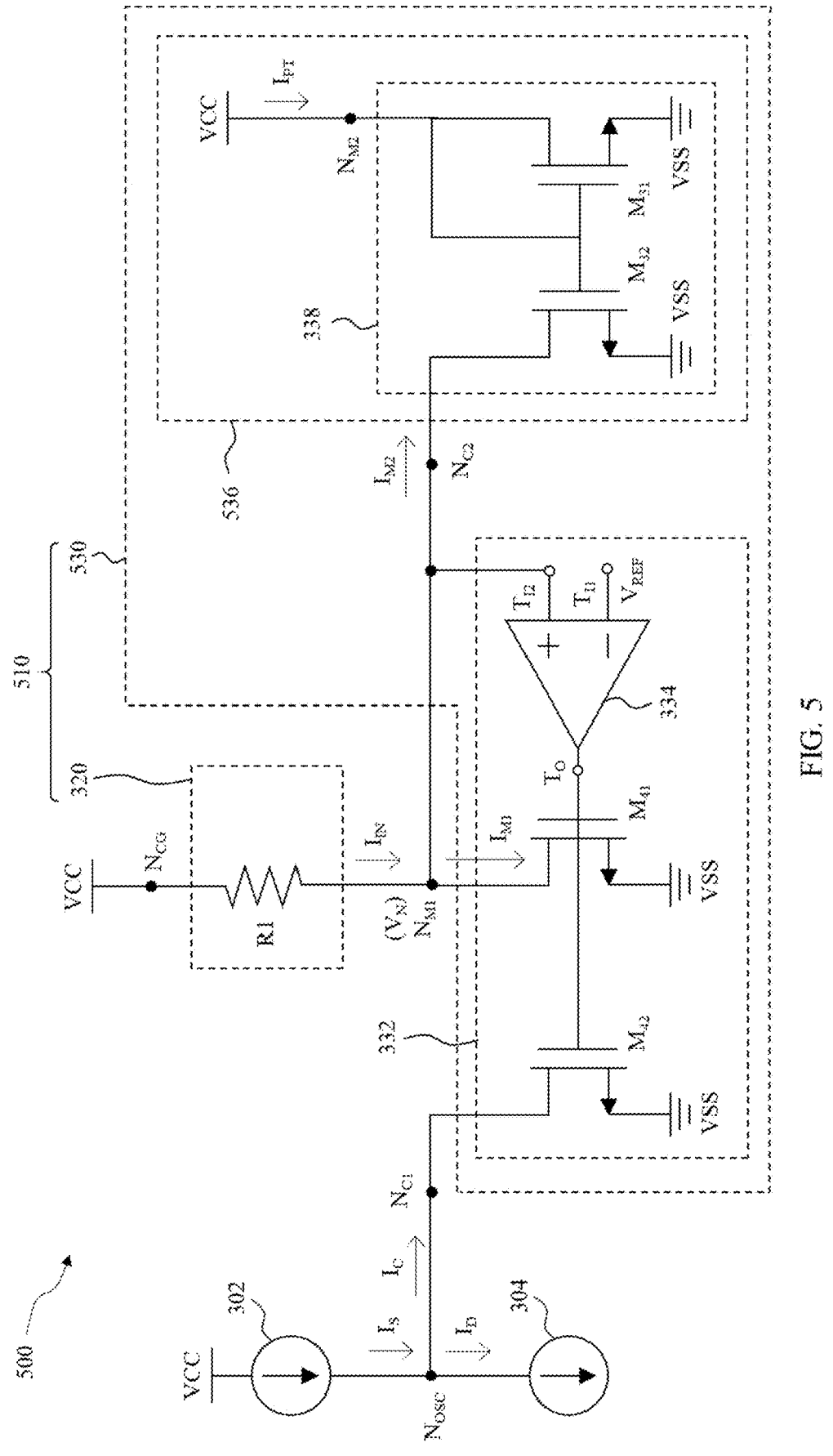
FIG. 5 illustrates an implementation of the oscillator circuit shown in FIG. 1 in accordance with some embodiments of the present disclosure.

FIG. 5 illustrates an implementation of the oscillator circuit 100 shown in FIG. 1 in accordance with some embodiments of the present disclosure. The oscillator circuit 500 may include the current generator 302 and the oscillator 304 shown in FIG. 3, and further include a current compensation circuit 510. The structure of the oscillator circuit 500 is similar/identical to that of the oscillator circuit 300 shown in FIG. 3 except for the current generator 536 included in the current generating circuit 530.

In the present embodiment, the control terminal and the first connection terminal of the transistor $M_{31}$ are coupled to the supply voltage VCC. The current mirror 338 can mirror the process-dependent current $I_{PT}$ to provide the current $I_{M2}$. With the use of the current compensation circuit 510, the oscillator circuit 500 can achieve a high PSRR over different process corners. As those skilled in the art can appreciate the operation of the oscillator circuit 500 shown in FIG. 5 after reading the above paragraphs directed to FIG. 1 to FIG. 4, further description is omitted here for brevity.

Figure 6:
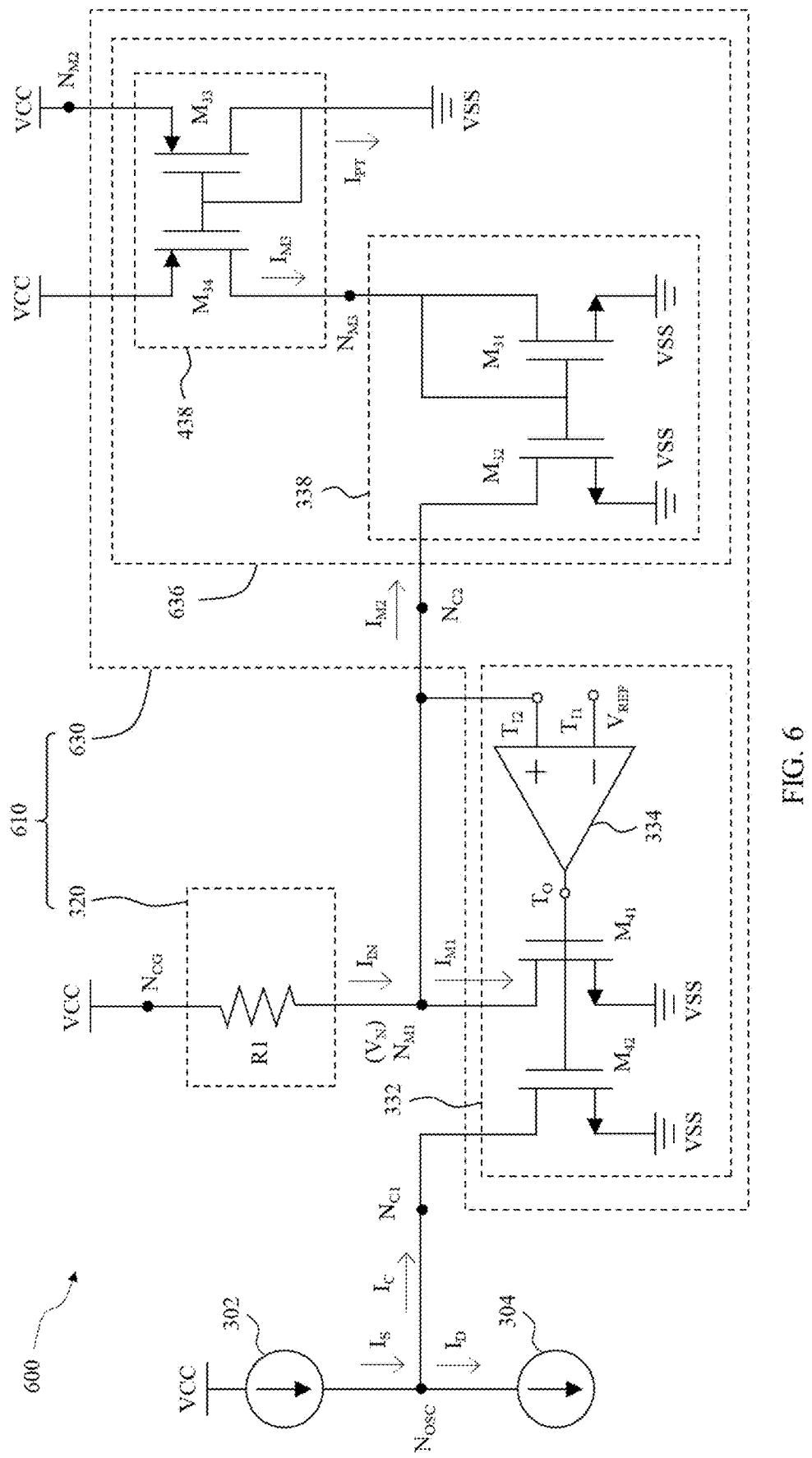
FIG. 6 illustrates an implementation of the oscillator circuit shown in FIG. 1 in accordance with some embodiments of the present disclosure.

FIG. 6 illustrates an implementation of the oscillator circuit 100 shown in FIG. 1 in accordance with some embodiments of the present disclosure. The oscillator circuit 600 may include the current generator 302 and the oscillator 304 shown in FIG. 3, and further include a current compensation circuit 610. The structure of the oscillator circuit 600 is similar/identical to that of the oscillator circuit 400 shown in FIG. 4 except for the current generator 636 included in the current generating circuit 630.

In the present embodiment, the second connection terminal of the transistor $M_{33}$ are coupled to the reference voltage VSS. The current mirror 438 can mirror the process-dependent current $I_{PT}$ to provide the current $I_{M3}$. With the use of the current compensation circuit 610, the oscillator circuit 600 can achieve a high PSRR over different process corners. As those skilled in the art can appreciate the operation of the oscillator circuit 600 shown in FIG. 6 after reading the above paragraphs directed to FIG. 1 to FIG. 5, further description is omitted here for brevity.

Figure 7:
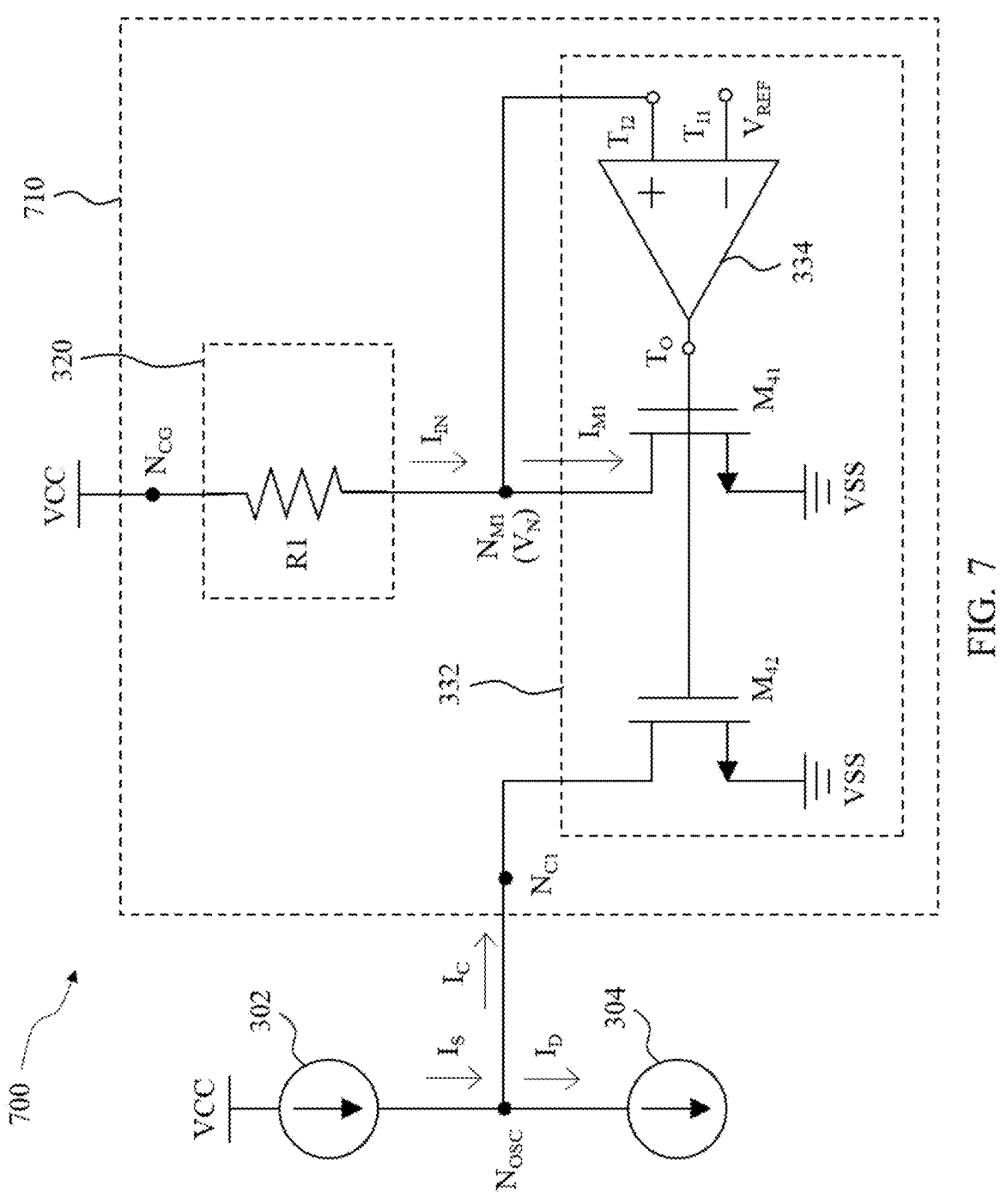
FIG. 7 illustrates an implementation of the oscillator circuit shown in FIG. 1 in accordance with some embodiments of the present disclosure.

FIG. 7 illustrates an implementation of the oscillator circuit 100 shown in FIG. 1 in accordance with some embodiments of the present disclosure. The structure of the oscillator circuit 700 is similar/identical to that of the oscillator circuit 300 shown in FIG. 3 except for the current compensation circuit 710. In the present embodiment, the input current $I_{IN}$ injected to the node $N_{M1}$ can serve as the current $I_{M1}$ inputted to the transistor $M_{41}$. With the use of the current compensation circuit 710, the oscillator circuit 700 can achieve a high PSRR. As those skilled in the art can appreciate the operation of the oscillator circuit 700 shown in FIG. 7 after reading the above paragraphs directed to FIG. 1 to FIG. 6, further description is omitted here for brevity.

Figure 8:
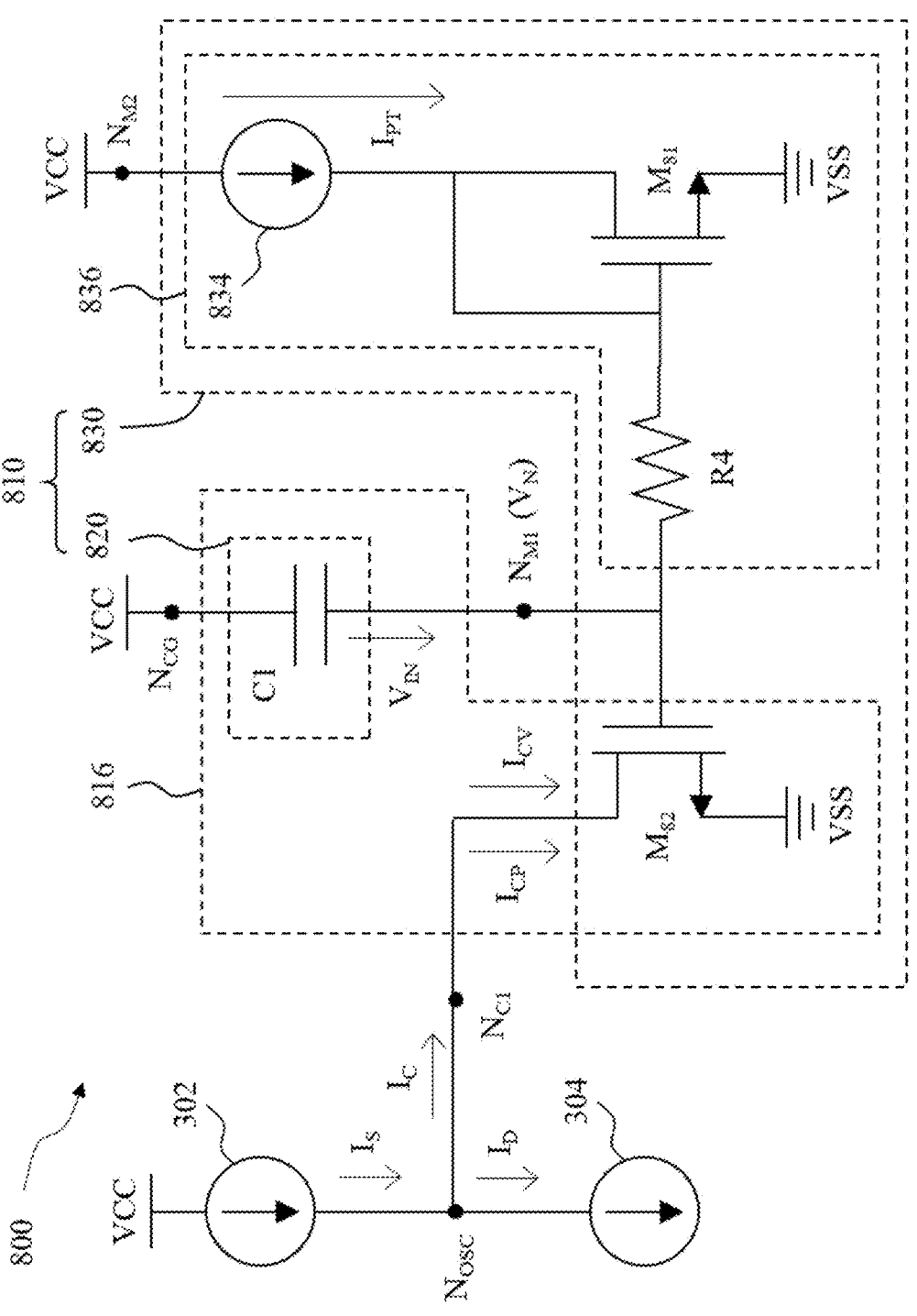
FIG. 8 illustrates an implementation of the oscillator circuit shown in FIG. 1 in accordance with some embodiments of the present disclosure.

FIG. 8 illustrates an implementation of the oscillator circuit 100 shown in FIG. 1 in accordance with some embodiments of the present disclosure. The structure of the oscillator circuit 800 is similar/identical to that of the oscillator circuit 300 shown in FIG. 3 except for the current compensation circuit 810. In the present embodiment, the input signal $S_{IN}$ shown in FIG. 2 can be a voltage signal applied to the node $N_{M1}$. For example, the signal generator 820 can be configured to provide an input voltage $V_{IN}$ by capacitively coupling the supply voltage VCC to the node $N_{M1}$. The input voltage $V_{IN}$ can serve as an embodiment of the input signal $S_{IN}$ shown in FIG. 2.

The signal generator 820 can be implemented using a voltage source arranged for providing the input voltage $V_{IN}$.

In the example of FIG. 8, the signal generator 820 can include a capacitive element C1, which can act as a voltage source coupled between the supply node $N_{CG}$ and the node $N_{M1}$. The input voltage $V_{IN}$ can carry information on a variation in (or an alternating current (AC) component of) the supply voltage VCC.

The current generating circuit 830 may include, but is not limited to, a current source 834, a transistor $M_{81}$ and a transistor $M_{82}$. In the present embodiment, the current source 834 can be related to the current generator 302. For example, the current source 834 can be coupled to the supply voltage VCC through the node $N_{M2}$, and arranged to provide the process-dependent current $I_{PT}$ that can be related to the effect of process variations on the supply current $I_S$.

In addition, a connection terminal of the transistor $M_{81}$ is coupled to a control terminal of the transistor $M_{81}$, and is further coupled to the current source 834 to receive the process-dependent current $I_{PT}$. A connection terminal of the transistor $M_{82}$ is coupled to the node $N_{C1}$. A control terminal of the transistor $M_{82}$ is coupled to the node $N_{M1}$, and electrically connected to the control terminal of the transistor $M_{81}$. In the example of FIG. 8, the control terminal of the transistor $M_{82}$ can be electrically connected to the control terminal of the transistor $M_{81}$ through a resistive element R4.

In operation, the current generating circuit 830 can act as a current mirror that mirrors the process-dependent current $I_{PT}$ to provide a first portion of the compensation current $I_C$ (represented by the current $I_{CP}$). A first component of the node voltage $V_N$ (e.g. a direct current (DC) component) can be developed at the node $N_{M1}$ in response to the process-dependent current $I_{PT}$. Additionally, supply noise or voltage ripples appearing on the supply voltage VCC can be capacitively coupled to the node $N_{M1}$, thereby producing the input voltage $V_{IN}$ which can serve as a second component of the node voltage $V_N$ (e.g. an AC component). A second portion of the current $I_C$ (represented by the current $I_{CV}$) can flow into the transistor $M_{82}$ in response to the second component of the node voltage $V_N$. Thus, the current $I_C$ can be related to the effect of PVT variations. The current compensation circuit 810 can draw the current $I_C$ from the supply node $N_{OSC}$ to compensate for a variation in the supply current $I_S$. The oscillator 304 can generate the oscillating signal $CK_{OSC}$ of a stable or substantially fixed frequency according to the driving current $I_D$.

With the use of the current compensation circuit 810, the oscillator circuit 800 can achieve a high PSRR over different process corners. Note that the circuit structure shown in FIG. 8 is provided for illustrative purposes, and is not intended to limit the scope of the present disclosure. In some embodiments, the first component of the node voltage $V_N$ can be developed using other circuits capable of providing the process-dependent current $I_{PT}$. In some embodiments, the resistive element R4 may be optional.

Figure 9:
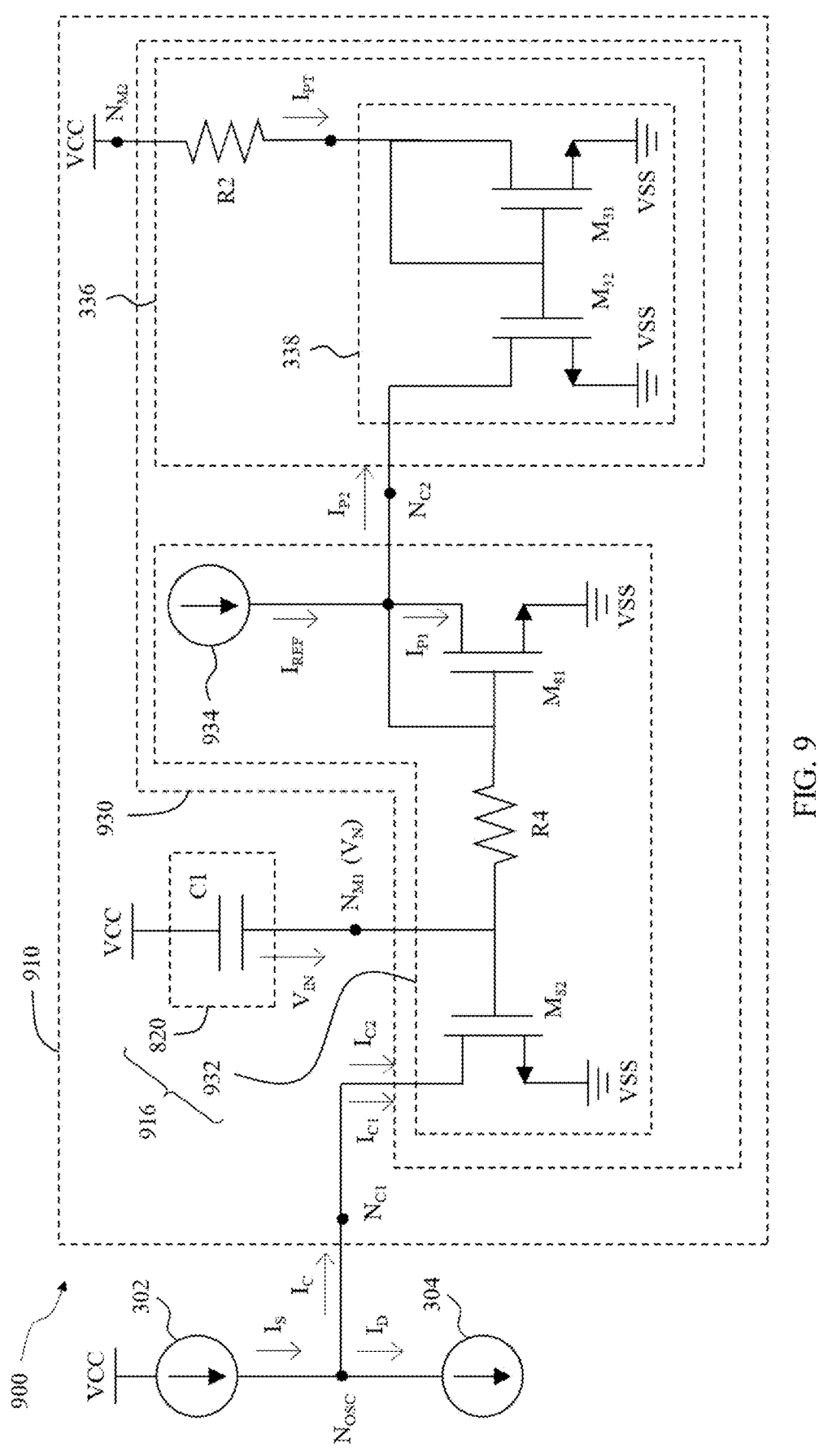
FIG. 9 illustrates an implementation of the oscillator circuit shown in FIG. 1 in accordance with some embodiments of the present disclosure.

FIG. 9 illustrates an implementation of the oscillator circuit 100 shown in FIG. 1 in accordance with some embodiments of the present disclosure. The structure of the oscillator circuit 900 is similar/identical to that of the oscillator circuit 800 shown in FIG. 8 except for the current generating circuit 930. In the present embodiment, the current generating circuit 930 includes, but is not limited to, the current generator 336 shown in FIG. 3 and a current mirror 932. The current mirror 932 may include the resistive element R4 and the transistors $M_{81}$ and $M_{82}$ shown in FIG. 8, and a current source 934 arranged for providing a reference current $I_{REF}$. A current level of the reference current $I_{REF}$ can be independent of or insensitive to a variation in the supply voltage VCC.

The current mirror 932 can be configured to mirror a first portion of the reference current $I_{REF}$ (i.e. the current Iri) to provide a first portion of the compensation current $I_C$ (represented by the current $I_{C1}$). The current $I_{P1}$ can be related to process and/or temperature variations. For example, the current generator 336, coupled to the current mirror 932 through the node $N_{C2}$, is configured to draw a second portion of the reference current $I_{REF}$ (i.e. the current $I_{P2}$) from the node $N_{C2}$ according to the process-dependent current $I_{PT}$. Both of the process-dependent current $I_{PT}$ and the current $I_{P2}$ can be related to process and/or temperature variations. Thus, the current $I_{P1}$, a result of subtraction of the current $I_{P2}$ from the reference current $I_{REF}$, can be related to process and/or temperature variations.

In operation, the current mirror 932 mirrors the current $I_{P1}$ to provide the first portion of the compensation current $I_C$ (i.e. the current $I_{C1}$ related to process and/or temperature variations). Supply noise or voltage ripples appearing on the supply voltage VCC can be capacitively coupled to the node $N_{M1}$, resulting in a second portion of the current $I_C$ (represented by the current $I_{C2}$) flowing into the transistor $M_{82}$. The current $I_{C2}$ is related to voltage variations. Thus, the current $I_C$ flowing into the node $N_{C1}$ can be related to the effect of PVT variations. The current compensation circuit 910 can draw the current $I_C$ from the supply node $N_{OSC}$ to compensate for a variation in the supply current $I_S$. The oscillator 304 can generate the oscillating signal $CK_{OSC}$ of a stable or substantially fixed frequency according to the driving current $I_D$.

With the use of the current compensation circuit 910, the oscillator circuit 800 can achieve a high PSRR over different process corners, and have a low temperature coefficient. As those skilled in the art can appreciate the operation of the oscillator circuit 900 shown in FIG. 9 after reading the above paragraphs directed to FIG. 1 to FIG. 8, further description is omitted here for brevity.

Figure 10:
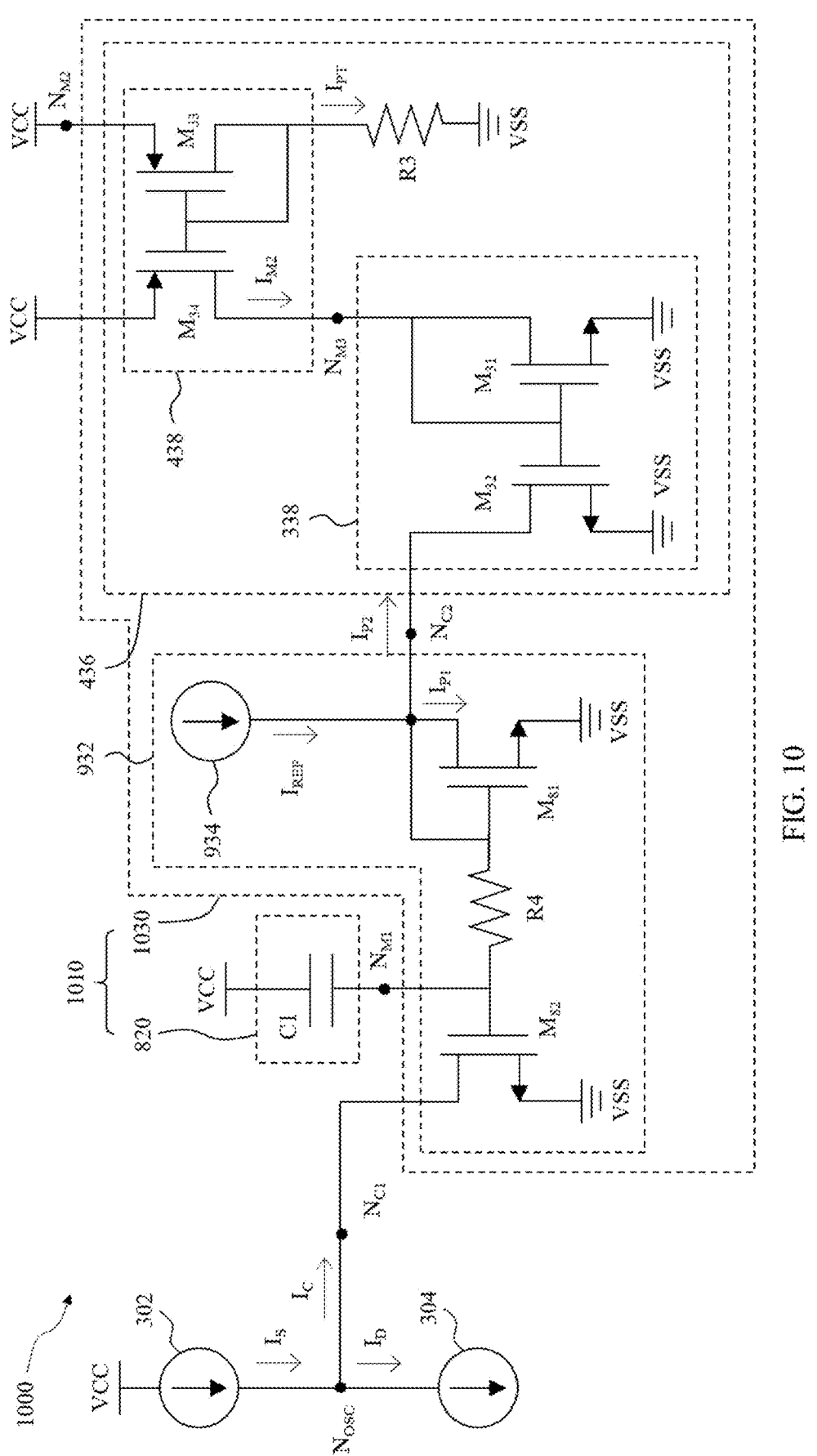
FIG. 10 illustrates an implementation of the oscillator circuit shown in FIG. 1 in accordance with some embodiments of the present disclosure.

FIG. 10 illustrates an implementation of the oscillator circuit 100 shown in FIG. 1 in accordance with some embodiments of the present disclosure. The structure of the oscillator circuit 1000 is similar/identical to that of the oscillator circuit 900 shown in FIG. 9 except that the current compensation circuit 1010 utilizes the current generator 436 shown in FIG. 4 to compensate for process and temperature variations. In some embodiments, the resistive element R3 may be optional. As those skilled in the art can appreciate the operation of the oscillator circuit 1000 shown in FIG. 10 after reading the above paragraphs directed to FIG. 1 to FIG. 9, further description is omitted here for brevity.

Figure 11:
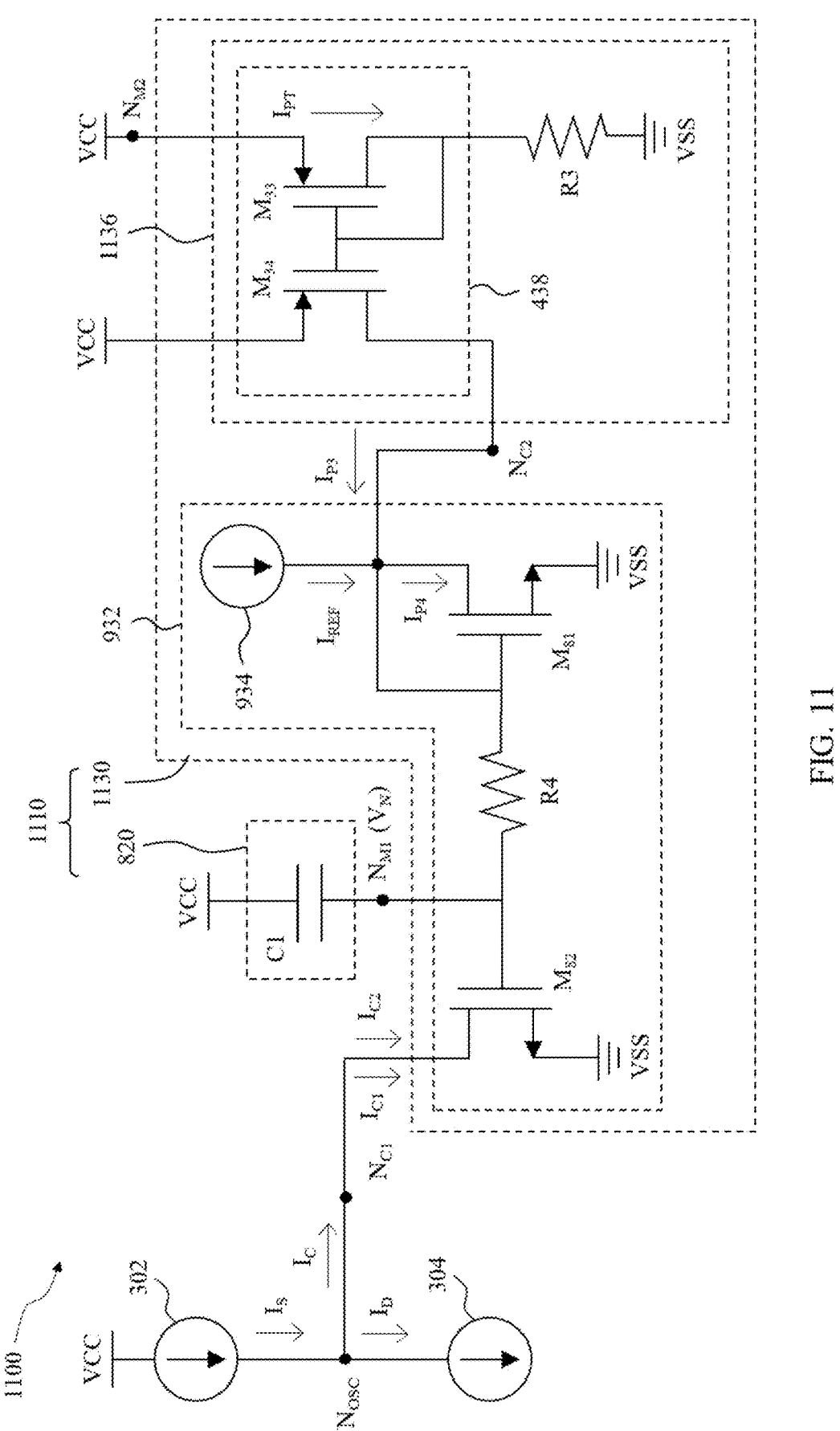
FIG. 11 illustrates an implementation of the oscillator circuit shown in FIG. 1 in accordance with some embodiments of the present disclosure.

FIG. 11 illustrates an implementation of the oscillator circuit 100 shown in FIG. 1 in accordance with some embodiments of the present disclosure. The structure of the oscillator circuit 1100 is similar/identical to that of the oscillator circuit 900 shown in FIG. 9 except for the current compensation circuit 1110. In the present embodiment, the current compensation circuit 1110 includes the signal generator 820 shown in FIG. 8, and a current generating circuit 1130.

The current generating circuit 1130 includes, but is not limited to, a current mirror 932 shown in FIG. 9 and a current generator 1136. In the example of FIG. 11, the current generator 1136 includes the current mirror 438 and the resistive element R3 shown in FIG. 4. The current mirror 438, coupled to the node $N_{C2}$, is arranged to mirror the process-dependent current $I_{PT}$ to provide a current $I_{P3}$ flowing into the node $N_{C2}$. The current $I_{P3}$ can be related to the effect of process variations and/or temperature variations on the supply current $I_S$. The current mirror 932 can provide a first portion of the compensation current $I_C$ (related to process and/or temperature variations) by mirroring the current $I_{P4}$, i.e. a sum of the reference current $I_{REF}$ and the current $I_{P3}$. The current mirror 932 can further provide a second portion of the compensation current $I_C$ in response to power supply noise capacitively coupled to the node $N_{M1}$. Thus, the current $I_C$ flowing into the node $N_{C1}$ can be related to the effect of PVT variations.

With the use of the current compensation circuit 1110, the oscillator circuit 1000 can achieve a high PSRR over different process corners, and have a low temperature coefficient. As those skilled in the art can appreciate the operation of the oscillator circuit 1100 shown in FIG. 11 after reading the above paragraphs directed to FIG. 1 to FIG. 10, further description is omitted here for brevity.

Figure 12:
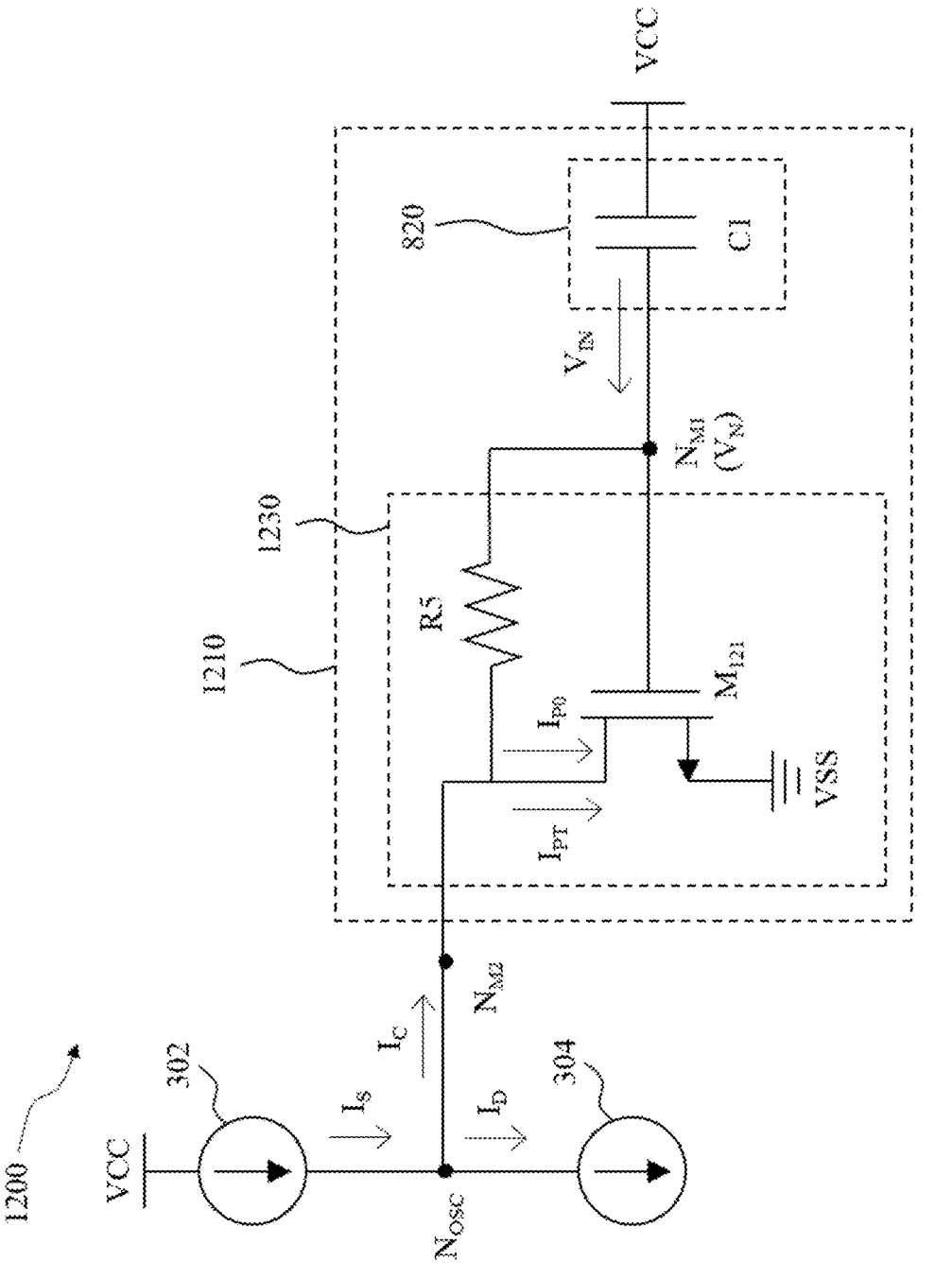
FIG. 12 illustrates an implementation of the oscillator circuit shown in FIG. 1 in accordance with some embodiments of the present disclosure.

FIG. 12 illustrates an implementation of the oscillator circuit 100 shown in FIG. 1 in accordance with some embodiments of the present disclosure. The structure of the oscillator circuit 1200 is similar/identical to that of the oscillator circuit 800 shown in FIG. 8 except for the current generating circuit 1230. In the present embodiment, the node $N_{M2}$ of the current generating circuit 1230 is coupled to the supply node $N_{OSC}$ to determine the current $I_C$. The current generating circuit 1230 may include, but is not limited to, a transistor $M_{121}$ and a resistive element R5. A control terminal of the transistor $M_{121}$ is coupled to the node $N_{M1}$, a first connection terminal of the transistor $M_{121}$ is coupled to the supply node $N_{OSC}$ through the node $N_{M2}$, and a second connection terminal of the transistor $M_{121}$ is coupled to the reference voltage VSS. The resistive element R5 is arranged for coupling the first connection terminal of the transistor $M_{121}$ to the control terminal of the transistor $M_{121}$.

In operation, when the supply voltage VCC stays at a constant level, the resistive element R5 coupled between the first connection terminal and the control terminal of the transistor $M_{121}$ can enable the process-dependent current $I_{PT}$ to flow into the transistor $M_{121}$ through the node $N_{M2}$. The process-dependent current $I_{PT}$ can be related to the effect of process variations on the supply current $I_S$. In addition, when supply noise or voltage ripples appear on the supply voltage VCC, the signal generator 820 can capacitively couple the supply noise or voltage ripples to the node $N_{M1}$ to thereby produce the input voltage $V_{IN}$, and the current compensation circuit 1210 can draw the current $I_C$ from the supply node $N_{OSC}$ to compensate for a variation in the supply current $I_S$. The oscillator 304 can generate the oscillating signal $CK_{OSC}$ of a stable or substantially fixed frequency according to the driving current $I_D$. In the example of FIG. 12, the current $I_C$ includes the process-dependent current $I_{PT}$ and a current $I_{P0}$, which flows into the transistor $M_{121}$ through the node $N_{M2}$ in response to the input voltage $V_{IN}$.

Note that at least a portion of the compensation current provided by the proposed current compensation scheme can be generated according to a supply voltage and a reference signal. At least the portion of the compensation current may correspond to the effect of supply noise or voltage variations on the supply current. A signal level of the reference signal is independent of a variation in the supply voltage.

Referring again to FIG. 2, the current compensation circuit 110 can be configured to generate at least a portion of the current $I_C$ according to the supply voltage VCC and a reference signal $S_{REF}$. A signal level of the reference signal $S_{REF}$ is independent of a variation in the supply voltage VCC, and at least the portion of the current $I_C$ changes in response to a variation in the supply voltage VCC. By way of example but not limitation, the reference signal $S_{REF}$ can be a reference voltage that is unaffected by the variation in the supply voltage VCC. As another example, the reference signal $S_{REF}$ can be a reference current that is unaffected by the variation in the supply voltage VCC. In addition, the current compensation circuit 110 can be configured to generate another portion of the current $I_C$ according to a process-dependent current (e.g. the process-dependent current $I_{PT}$).

For example, referring again to FIG. 3, the reference signal $S_{REF}$ shown in FIG. 2 can be implemented using the node voltage $V_N$ coupled to the node $N_{C2}$. The signal generator 320 and the current mirror 332 can serve as at least a portion of a current generator 316. The current generator 316 can be configured to generate the input current $I_{IN}$ according to the supply voltage VCC and the node voltage $V_N$, and draw the current $I_C$ from the supply node $N_{OSC}$ according to the input current $I_{IN}$ and a process-dependent current applied to the node $N_{M1}$ (i.e. the current $I_{M2}$). In addition, the current generator 336 is configured to generate the process-dependent current $I_{PT}$, and provide the current $I_{M2}$ according to the process-dependent current $I_{PT}$. The combination of the input current $I_{IN}$ and the current $I_{M2}$, e.g. the subtraction of the current $I_{M2}$ from the input current $I_{IN}$, can serve as a compensation current generated by the compensation circuit 310. The compensation circuit 310 can draw a compensation current (i.e. the current $I_C$) from the supply node $N_{OSC}$ according to the combination of the input current $I_{IN}$ and the current $I_{M2}$.

As another example, referring again to FIG. 8, the reference signal $S_{REF}$ shown in FIG. 2 can be implemented using the reference voltage VSS, which has a voltage level independent of a variation in the supply voltage VCC. The capacitive element C1 and the transistor $M_{82}$ can serve as at least a portion of a current generator 816. The current generator 816 can be configured to generate an input current (i.e. the current $I_{CV}$) according to the supply voltage VCC and the reference voltage VSS, and draw the current $I_C$ from the supply node $N_{OSC}$ according to the input current and a first component (e.g. the DC component) of the node voltage $V_N$ at the node $N_{M1}$. Additionally or alternatively, the resistive element R4, the current source 834 and the transistor $M_{81}$ can serve as at least a portion of a current generator 836. The current generator 836 can be configured to generate the process-dependent current $I_{PT}$, and provide the first component (e.g. the DC component) of the node voltage $V_N$ according to the process-dependent current $I_{PT}$. The combination of the current $I_{CP}$ (i.e. a portion of the current $I_C$ that flows into the transistor $M_{82}$ in response to the first component (e.g. the DC component) of the node voltage $V_N$) and the current $I_{CV}$ (i.e. a portion of the current $I_C$ that flows into the transistor $M_{82}$ in response to the second component (e.g. the AC component) of the node voltage $V_N$) can serve as the compensation current provided by the compensation circuit 810 (i.e. the current $I_C$).

As still another example, referring again to FIG. 9, the reference signal $S_{REF}$ shown in FIG. 2 can be implemented using the reference voltage VSS. The signal generator 820 and the current mirror 932 can serve as at least a portion of a current generator 916. The current generator 916 can be configured to generate the current $I_{C1}$ according to a subtraction of the current $I_{P2}$ (i.e. a process-dependent current) from the reference current $I_{REF}$. The current generator 916 can be further configured to generate the current $I_{C2}$ according to the supply voltage VCC and the node voltage $V_N$.

The circuit structures described above are provided for illustrative purposes, and are not intended to limit the scope of the present disclosure. For example, in some embodiments, the current compensation circuit 110 shown in FIG.

2 can be implemented to include a first current generator and a second current generator. The first current generator can be configured to generate an input current (e.g. the input current $I_{IN}$ shown in FIG. 3, or the current $I_{CV}$ shown in FIG. 8) according to the supply voltage VCC and the reference signal $S_{REF}$ (e.g. the node voltage $V_N$ shown in FIG. 3, or the reference voltage VSS in FIG. 8), and draw the current $I_C$ from the supply node $N_{OSC}$ according to the input current and an electrical signal (e.g. the current $I_{M2}$ shown in FIG. 3, or the DC component of the node voltage $V_N$ shown in FIG. 8) applied to the node $N_{M1}$. The first current generator and/or the second current generator can be implemented using other circuit structures without departing from the scope of the present disclosure.

In addition, referring again to FIG. 12, the reference signal $S_{REF}$ shown in FIG. 2 can be implemented using the reference voltage VSS that has a voltage level independent of a variation in the supply voltage VCC. The capacitive element C1 is arranged to couple the supply voltage VCC to the control terminal of the transistor $M_{121}$ to enable a first portion of the current $I_C$ (i.e. the current $I_{PO}$) to flow into the transistor $M_{121}$. The resistive element R5 is arranged to couple the first connection terminal of the transistor $M_{121}$ to the control terminal of the transistor $M_{121}$ to enable a second portion of the current $I_C$ (i.e. the process-dependent current $I_{PT}$) to flow into the transistor $M_{121}$.

As those skilled in the art can appreciate the operation of a current compensation circuit, which is configured to generate a first portion of a compensation current according to a supply voltage and a reference signal and generate a second portion of the compensation current according to a process-dependent current, after reading the above paragraphs directed to FIG. 1 to FIG. 12, further description is omitted here for brevity.

With the use of the proposed current compensation scheme, an oscillator circuit can generate an oscillating signal of a stable or substantially fixed frequency under power supply variations. The proposed current compensation scheme can enable the oscillator circuit to enhance the immunity to power supply noise. In addition, the oscillator circuit can be utilized to implement a PLL with reduced jitter and phase noise. The proposed current compensation scheme can improve the PSRR performance without increasing the voltage headroom of the PLL.

As used herein, the terms "substantially" are used to describe and account for small variations. When used in conduction with an event or circumstance, the terms can refer to instances in which the event of circumstance occurs precisely as well as instances in which the event or circumstance occurs to a close approximation. As used herein with respect to ta given value or range, the term "substantially" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. In addition, when referring to numerical values or characteristics as "substantially" the same, the term can refer to the values lying within ±10%, ±5%, ±1%, or ±0.5% of an average of the values.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A current compensation circuit for an oscillator, comprising:
   a current generating circuit, having a first node and a second node, the first node being coupled to an input signal, the second node being coupled to a process-dependent current, the current generating circuit being configured to provide a compensation current according to the input signal and the process-dependent current, wherein the process-dependent current and the input signal are transmitted into the current generating circuit via separate paths, respectively; and
   a signal generator, coupled to the first node, the signal generator being configured to couple a supply voltage to the first node to provide the input signal different from the supply voltage, wherein a signal level of the input signal changes in response to a variation in the supply voltage;
   wherein a supply node of the oscillator is arranged to receive a supply current to drive the oscillator, and the compensation current flows from the supply node of the oscillator into the current generating circuit to compensate for a variation in the supply current generated in response to the variation in the supply voltage.

2. The current compensation circuit of claim 1, wherein the current generating circuit is configured to provide a node voltage at the first node, and the node voltage is independent of the variation in the supply voltage; the signal generator is configured to provide an input current according to a difference between the supply voltage and the node voltage, and the input current flows into the first node to serve as the input signal.

3. The current compensation circuit of claim 2, wherein a supply node of the signal generator is coupled to the supply voltage; the signal generator comprises a resistive element coupled between the supply node of the signal generator and the first node.

4. The current compensation circuit of claim 2, wherein the current generating circuit comprises:
   a first current mirror, coupled to the supply node of the oscillator and the first node, the first current mirror being arranged to provide the node voltage at the first node, draw a first portion of the input current from the first node, and mirror the first portion of the input current to provide the compensation current; and
   a current generator, coupled to the first node and the second node, the current generator being configured to draw a second portion of the input current from the first node according to the process-dependent current.

5. The current compensation circuit of claim 4, wherein the first current mirror comprises:
   an amplifier, wherein a first input terminal of the amplifier is coupled to a reference voltage; a second input terminal of the amplifier is coupled to the first node, and arranged to provide the node voltage at the first node according to the reference voltage;
   a first transistor, wherein a control terminal of the first transistor is coupled to an output terminal of the amplifier, a connection terminal of the first transistor is coupled to the first node, and the first portion of the input current flows into the first transistor from the connection terminal of the first transistor; and a second transistor, wherein a control terminal of the second transistor is coupled to the output terminal of the amplifier, a connection terminal of the second transistor is coupled to the supply node of the oscillator, and the compensation current flows into the second transistor from the connection terminal of the second transistor.

6. The current compensation circuit of claim 5, wherein the node voltage is equal to the reference voltage.

7. The current compensation circuit of claim 4, wherein the current generator comprises:

a second current mirror, arranged to mirror the process-dependent current to draw the second portion of the input current from the first node, wherein the process-dependent current flows through a transistor of the second current mirror.

8. The current compensation circuit of claim 7, wherein the current generator further comprises a resistive element coupled to the transistor, and the process-dependent current flows through the transistor and the resistive element.

9. The current compensation circuit of claim 4, wherein the current generator comprises:

a second current mirror, arranged to mirror an intermediate current to draw the second portion of the input current from the first node;

a third current mirror, coupled to the second current mirror, the third current mirror being arranged to mirror the process-dependent current to provide the intermediate current; and a resistive element, coupled to the third current mirror, wherein the process-dependent current flows through a transistor of the third current mirror and the resistive element.

10. The current compensation circuit of claim 1, wherein the signal generator is configured to provide an input voltage at the first node by capacitively coupling the supply voltage to the first node, and the input voltage serves as the input signal.

11. The current compensation circuit of claim 10, wherein the current generating circuit comprises:

a current source, coupled to the second node, the current source being arranged to provide the process-dependent current;

a first transistor, wherein a connection terminal of the first transistor is coupled to a control terminal of the first transistor, and is coupled to the current source to receive the process-dependent current; and a second transistor, wherein a connection terminal of the second transistor is coupled to the supply node of the oscillator, and a control terminal of the second transistor is coupled to the first node and electrically connected to the control terminal of the first transistor.

12. The current compensation circuit of claim 10, wherein the current generating circuit comprises:

a current source, arranged to provide a reference current, wherein a current level of the reference current is independent of the variation in the supply voltage;

a first transistor, wherein a connection terminal of the first transistor is coupled to a control terminal of the first transistor, and is coupled to the current source to receive a first portion of the reference current;

a second transistor, wherein a connection terminal of the second transistor is coupled to the supply node of the oscillator to receive the compensation current, and a control terminal of the second transistor is coupled to the first node and electrically connected to the control terminal of the first transistor; and a current generator, coupled to the second node, the current generator being configured to draw a second portion of the reference current from the current source according to the process-dependent current.

13. The current compensation circuit of claim 10, wherein the second node is coupled to the supply node of the oscillator to determine the compensation current, and the current generating circuit comprises:

a transistor, wherein a control terminal of the transistor is coupled to the first node, a first connection terminal of the transistor is coupled to the supply node of the oscillator through the second node, and a second connection terminal of the transistor is coupled to a reference voltage; a first portion of the compensation current flows through the second node in response to the input voltage provided by the signal generator; and a resistive element, arranged to couple the first connection terminal to the control terminal of the transistor to enable a second portion of the compensation current to flow through the second node, wherein the second portion of the compensation current serves as the process-dependent current.

14. An oscillator circuit, comprising:

a current generator, supplied by a supply voltage to output a supply current;

an oscillator, having a supply node arranged to receive the supply current, the oscillator being arranged to generate an oscillating signal according to a driving current, wherein a first portion of the supply current flows into the oscillator from the supply node of the oscillator to serve as the driving current; and a current compensation circuit, coupled to the supply node of the oscillator, the current compensation circuit being configured to generate a first portion of a compensation current according to the supply voltage and a reference signal, and generate a second portion of the compensation current according to a first process-dependent current, wherein a signal level of the reference signal is independent of a variation in the supply voltage, and the first portion of the compensation current changes in response to the variation in the supply voltage; the current compensation circuit is arranged to draw the compensation current from the supply node of the oscillator to compensate for a variation in the supply current generated in response to the variation in the supply voltage.

15. The oscillator circuit of claim 14, wherein the current compensation circuit comprises:

a first current generator, coupled to the supply node of the oscillator and having a first node, the first current generator being configured to generate an input current according to the supply voltage and the reference signal, and draw the compensation current from the supply node of the oscillator according to the input current and an electrical signal applied to the first node; and a second current generator, coupled to the first node, the second current generator being configured to generate the first process-dependent current, and provide the electrical signal to the first node according to the first process-dependent current.

16. The oscillator circuit of claim 15, wherein the electrical signal provided by the second current generator is a second process-dependent current, and the first current generator comprises:

a current mirror, coupled to the supply node of the oscillator and the first node, the current mirror being arranged to provide a node voltage at the first node, draw a first portion of the input current from the first node, and mirror the first portion of the input current to provide the compensation current, wherein the node voltage at the first node serves as the reference signal, and a voltage level of the node voltage is independent of the variation in the supply voltage; and a current source, coupled to the first node and having a supply node coupled to the supply voltage, the current source being arranged to provide the input current according to the difference between the supply voltage and the node voltage.

17. The oscillator circuit of claim 15, wherein the second current generator comprises:

a current mirror, arranged to mirror the first process-dependent current to provide the second process-dependent current, wherein the first process-dependent current flows through a transistor of the current mirror.

18. The oscillator circuit of claim 15, wherein the reference signal is a reference voltage having a voltage level independent of the variation in the supply voltage; the electrical signal provided by the second current generator is a first component of a node voltage at the first node; the first current generator comprises:

a capacitive element, arranged to provide a second component of the node voltage at the first node by capacitively coupling the supply voltage to the first node; and a first transistor, wherein a connection terminal of the first transistor is coupled to the supply node of the oscillator to receive the compensation current, a control terminal of the first transistor is coupled to the first node, and a second connection terminal of the first transistor is coupled to the reference voltage;

wherein a first portion of the compensation current flows into the first transistor in response to the first component of the node voltage; a second portion of the compensation current flows into the first transistor in response to the second component of the node voltage, and serves as the input current.

19. The oscillator circuit of claim 18, wherein the second current generator comprises:

a resistive element, wherein a first terminal of the resistive element is coupled to the first node;

a current source, arranged to provide the process-dependent current; and a second transistor, wherein a connection terminal of the second transistor is coupled to the current source to receive the process-dependent current; a control terminal of the second transistor is coupled to the connection terminal of the second transistor, and is coupled to a second terminal of the resistive element to provide the first component of the node voltage to the first node.

20. The oscillator circuit of claim 14, wherein the reference signal is a reference voltage having a voltage level independent of the variation in the supply voltage, and the current compensation circuit comprises:

a transistor, wherein a first connection terminal of the transistor is coupled to the supply node of the oscillator, and a second connection of the transistor is coupled to the reference voltage;

a capacitive element, arranged to couple the supply voltage to a control terminal of the transistor to enable a first portion of the compensation current to flow into the transistor; and a resistive element, arranged to couple the first connection terminal to the control terminal to enable a second portion of the compensation current to flow into the transistor, wherein the second portion of the compensation current serves as the process-dependent current.

* * * * *